United States Patent
Lee et al.

(10) Patent No.: US 6,448,146 B1
(45) Date of Patent: Sep. 10, 2002

(54) METHODS OF MANUFACTURING INTEGRATED CIRCUIT CAPACITORS HAVING HEMISPHERICAL GRAIN ELECTRODES

(75) Inventors: Seung-hwan Lee; Ki-yeon Park; Jae-soon Lim, all of Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/862,367

(22) Filed: May 22, 2001

(30) Foreign Application Priority Data

Dec. 4, 2000 (KR) ........................................ 2000-72940

(51) Int. Cl.[7] ...................... H01L 21/20; H01L 21/8242
(52) U.S. Cl. ........................ 438/398; 438/254; 438/397
(58) Field of Search .................................. 438/398, 397, 438/396, 255, 254, 253

(56) References Cited

U.S. PATENT DOCUMENTS

| | | | |
|---|---|---|---|
| 4,636,833 A | 1/1987 | Nishioka et al. | 357/71 |
| 5,142,438 A | 8/1992 | Reinberg et al. | 361/313 |
| 5,352,623 A | 10/1994 | Kamiyama | 437/52 |
| 5,362,632 A | 11/1994 | Mathews | 437/47 |
| 5,385,863 A | 1/1995 | Tatsumi et al. | 437/109 |
| 5,407,534 A | 4/1995 | Thakur | 156/662 |
| 5,447,881 A | 9/1995 | Ryou | 437/60 |
| 5,452,178 A | 9/1995 | Emesh et al. | 361/303 |
| 5,459,345 A | 10/1995 | Okudaira et al. | 257/310 |
| 5,486,488 A | 1/1996 | Kamiyama | 437/60 |
| 5,492,850 A | 2/1996 | Ryou | 437/52 |
| 5,554,557 A | 9/1996 | Koh | 437/52 |
| 5,612,558 A | 3/1997 | Harshfield | 257/298 |
| 5,623,243 A | 4/1997 | Watanabe et al. | 257/309 |
| 5,663,085 A | 9/1997 | Tanigawa | 438/255 |
| 5,963,804 A * | 10/1999 | Figura et al. | 438/255 |
| 6,214,688 B1 | 4/2001 | Hwang et al. | 438/396 |
| 6,218,260 B1 | 4/2001 | Lee et al. | 438/398 |
| 6,258,691 B1 * | 7/2001 | Kim | 438/398 |
| 6,294,437 B1 * | 9/2001 | Lin | 438/396 |
| 6,307,730 B1 * | 10/2001 | Yamanishi | 257/308 |
| 6,319,771 B1 * | 11/2001 | Tseng | 438/398 |
| 2002/0039826 A1 * | 4/2002 | Reinberg | 438/399 |

OTHER PUBLICATIONS

Kamiyama et al., "Characterization of Ultra–Thin Capacitors Fabricated Using RTN Treatment Prior to VCD $Ta_2O_5$ Film Formation," Extended Abstracts of the 1992 International Conference on Solid State Devices and Materials, Tsukuba, 1992, pp. 521–523.

* cited by examiner

*Primary Examiner*—Michael Trinh
(74) *Attorney, Agent, or Firm*—Myers Bigel Sibley & Sajovec

(57) ABSTRACT

Methods of manufacturing integrated circuit capacitors include the steps of forming a first electrically insulating layer having an opening therein, on a semiconductor substrate and then forming an electrically conductive electrode layer on an upper surface of the first electrically insulating layer and on a sidewall of the opening within the first electrically insulating layer. The electrically conductive electrode layer is then covered with a second electrically insulating layer. The second electrically insulating layer and the electrically conductive electrode layer are then planarized to expose the upper surface of the first electrically insulating layer and define a capacitor electrode layer on the sidewall of the opening. The capacitor electrode layer is then selectively etched back to expose the sidewall of the opening and define a lower capacitor electrode that is recessed relative to the upper surface of the first electrically insulating layer. This etching step is performed using the planarized second electrically insulating layer and the first electrically insulating layer as an etching mask. The planarized second electrically insulating layer and the upper surface of the first electrically insulating layer are then removed to expose the lower capacitor electrode. Hemispherical silicon grains (HSGs) are formed on an inner surface of the exposed lower capacitor electrode.

16 Claims, 4 Drawing Sheets

METHODS OF MANUFACTURING INTEGRATED CIRCUIT CAPACITORS HAVING HEMISPHERICAL GRAIN ELECTRODES

RELATED APPLICATION

This application claims priority to Korean Application No. 2000-72940, filed Dec. 4, 2000, the disclosure of which is hereby incorporated herein by reference.

FIELD OF THE INVENTION

The present invention relates to methods of manufacturing integrated circuit capacitors, and more particularly, to methods of manufacturing capacitors having HSG electrodes.

BACKGROUND OF THE INVENTION

As the integration of dynamic random access memory (DRAM) devices having capacitors as components of memory cells therein is increased, the area of each capacitor within each memory cell is typically decreased. Various methods of manufacturing capacitors having the same capacitance and reliability as those of the prior art or having greater capacitance and reliability than those of the prior art, yet occupying smaller lateral area, have been studied. One conventional method of increasing an effective surface area of an electrode includes forming HSG on a surface of the electrode. Particularly, as shown in FIG. 1, in a cylindrical HSG capacitor having the illustrated structure, the HSG is formed only on an internal surface of a cylindrical lower electrode 17 and an external surface of the lower electrode 17 is surrounded by an insulating layer 14 and is not used as an effective surface area of the lower electrode 17. Because the manufacturing process of the cylindrical HSG capacitor is comparatively simple, and a defect rate in its manufacture is relatively low, the cylindrical HSG capacitor is widely used. In FIG. 1, reference numeral 22 denotes a dielectric layer of a capacitor, and reference numeral 24 denotes an upper electrode of a capacitor.

The steps of manufacturing a capacitor having the above structure shown in FIG. 1 will now be described with reference to FIGS. 2 and 3. First, an interdielectric layer 10 in which devices (not shown) such as transistors are formed, is etched to form contact holes. Then, a conductive material is filled in the contact holes to form contact plugs 12. Subsequently, a mold insulating layer 14 having openings for exposing the contact plugs 12 is formed, and lower electrodes are formed in the openings. Amorphous silicon is then conformally deposited on the entire surface of the mold insulating layer 14 having the openings and the exposed contact plug 12 to form a lower electrode layer 16.

Subsequently, a planarization insulating layer 18 comprising an insulating material having generally good gap fill characteristics is formed on the lower electrode layer 16. The planarization insulating layer 18 may prevent slurry particulate or other residue of the polished lower electrode layer 16 from being attached to and contaminating concave portions of the lower electrode layer 16 when a chemical mechanical polishing (hereinafter referred to as CMP) process is subsequently performed to form the separated lower electrodes by removing/planarizing the lower electrode layer 16 down to the dotted line 20 indicated in FIG. 2.

Subsequently, the separated lower electrodes are formed by performing the CMP process on the lower electrode layer 16 down to the dotted line 20. The planarization insulating layer 18 remaining in the concave portions of the separated lower electrodes is then removed. Subsequently, HSG is formed on the surface of the concave portions of the separated and exposed lower electrodes using a conventional method, as shown in FIG. 3.

However, as shown in FIG. 3, a lower electrode 17 is slightly (to a height h) projected out of the surface of the mold insulating layer 14' and is therefore not flush with the mold insulating layer 14'. This is because the mold insulating layer 14 is also etched to a certain degree and becomes recessed when the planarization insulating layer 18 filling the concave portions of the separated lower electrodes is removed. In general, spin-on-glass (SOG) or undoped silicate glass (USG) having good gap fill characteristics is used as the planarization insulating layer 18, and plasma enhanced tetraethylortho silicate (PE-TEOS) or phosphor silicate glass (PSG) is used as the mold insulating layer 14. In order to remove the planarization insulating layer 18, a wafer is wet etched by soaking the wafer in an etching solution including a hydrofluoric acid (HF) solution for a comparatively long time. Even though the etching selection ratio of SOG or USG with respect to PE-TEOS or PSG in the etching solution is typically very high, the etching selection ratio does not reach 100%. Thus, the mold insulating layer 14 (of FIG. 2) is typically etched back to a certain degree while the planarization insulating layer 18 is being etched.

As a result, HSG may also be formed on an upper surface and an upper portion of the lower electrode 17 (see 17'), and a desired capacitor as shown in FIG. 1 is not obtained. When the HSG is formed on the upper surface and the external surface of the lower electrode 17, an upper portion 17' of the lower electrode 17 may become broken in a following cleaning process. In addition, HSGs, which are formed on the external upper surface of the lower electrode 17, can contact each other and this can cause adjacent electrodes to become short-circuited.

SUMMARY OF THE INVENTION

A method of forming an integrated circuit capacitor according to a first embodiment of the present invention may improve reliability by reducing the likelihood of lower electrode breakage and shorting (e.g., stringer formation) during fabrication. According to this embodiment, a method is provided that includes the steps of forming a first electrically insulating layer having an opening therein, on a semiconductor substrate. This first electrically insulating layer may extend directly on the substrate or may constitute an upper level interlayer dielectric layer. An electrically conductive electrode layer is then formed on an upper surface of the first electrically insulating layer and on a sidewall of the opening within the first electrically insulating layer. The electrically conductive electrode layer is then covered with a second electrically insulating layer. The second electrically insulating layer and the electrically conductive electrode layer are then planarized to expose the upper surface of the first electrically insulating layer and define a capacitor electrode layer on the sidewall of the opening. This capacitor electrode layer may have a U-shaped cross-section.

The capacitor electrode layer is then selectively etched-back to expose the sidewall of the opening and define a lower capacitor electrode that is recessed relative to the upper surface of the first electrically insulating layer. This selective etching step is preferably performed using the planarized second electrically insulating layer and the first electrically insulating layer as an etching mask. This step, which causes a recession of the vertical extent of the lower capacitor electrode (e.g., vertical sides of a U-shaped electrode), can be performed to improve reliability by inhibiting breakage of the ends of the lower capacitor electrode when subsequent steps are performed to etch-back layers and regions that support or surround the lower capacitor electrode. The planarized second electrically insulating layer and the upper surface of the first electrically insulating layer are then removed simultaneously to expose the lower capacitor electrode. This removal step may be performed as an etching step that selectively etches the planarized second electrically insulating layer at a faster rate than the first electrically insulating layer. Hemispherical silicon grains (HSGs) are then formed on an inner surface of the exposed lower capacitor electrode. A complete capacitor structure is then formed by forming a dielectric layer on the exposed lower capacitor electrode and then forming an upper capacitor electrode on the dielectric layer.

Methods according to another embodiment of the present invention may also include forming an interdielectric layer having a conductive plug therein, directly on a surface of a semiconductor substrate. This conductive plug may directly contact a semiconductor region within the substrate. In the event an integrated circuit capacitor is used in a dynamic random access memory (DRAM) device, the semiconductor region may constitute a source/drain region of an access transistor within a DRAM memory cell. After the conductive plug has been formed, a mold insulating layer is preferably formed on the interdielectric layer. A step is also performed to pattern the mold insulating layer to define an opening therein that exposes the conductive plug within the interdielectric layer. An electrically conductive electrode layer is then formed on an upper surface of the mold insulating layer, on a sidewall of the opening within the mold insulating layer and on the conductive plug. This electrically conductive electrode layer may be formed by conformally depositing a blanket polysilicon layer on the mold insulating layer.

The electrically conductive electrode layer is then covered with a planarization insulating layer. This planarization insulating layer also extends into the opening within the mold insulating layer. The planarization insulating layer and the electrically conductive electrode layer are then planarized to expose the upper surface of the mold insulating layer and define a capacitor electrode layer that extends on the sidewall of the opening and on the conductive plug. To reduce the likelihood of breakage of the capacitor electrode layer, the capacitor electrode layer is then selectively etched back to expose the sidewall of the opening and define a lower capacitor electrode that is recessed relative to the upper surface of the mold insulating layer. The planarization insulating layer is then removed along with a portion of an upper surface of the mold insulating layer. This removal step exposes an inner surface of the lower capacitor electrode. This removal step may comprise etching the planarization insulating layer at a first rate while simultaneously etching the upper surface of the mold insulating layer at a second rate slower than the first rate. Hemispherical silicon grains (HSGs) are then formed on the inner surface of the lower capacitor electrode. The mold insulating layer may be etched again to expose an outer surface of the lower capacitor electrode. A dielectric layer and upper capacitor electrode layer are then formed on the lower capacitor electrode.

DESCRIPTION OF PREFERRED EMBODIMENTS

Figure 1:
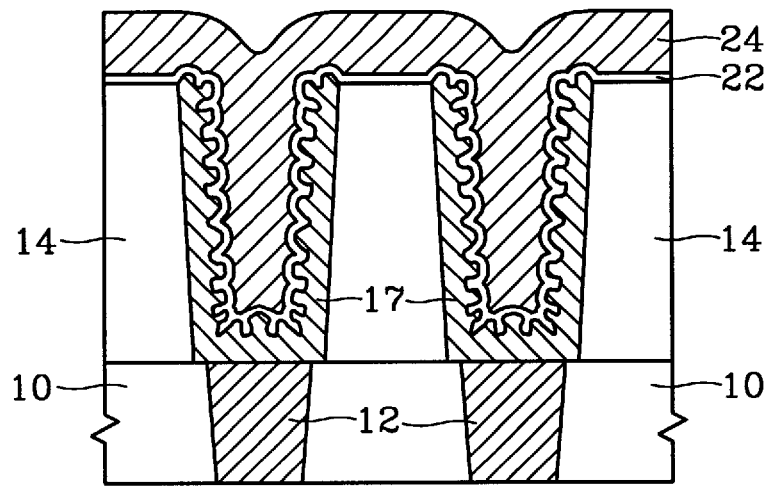
FIG. 1 is a sectional view of a conventional capacitor in which hemispherical grains (HSG) are formed on an internal surface of a cylindrical lower electrode.
Figure 2:
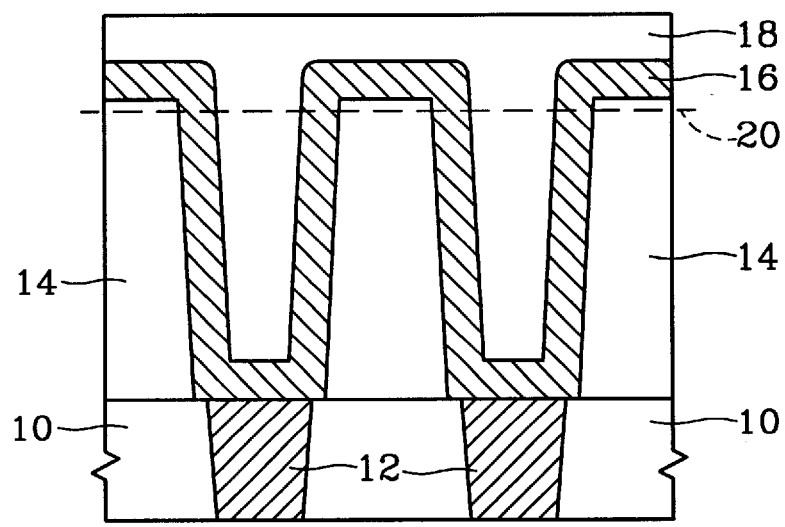
FIGS. 2 and 3 are cross-sectional views illustrating steps of manufacturing a capacitor-according to the prior art.
Figure 3:
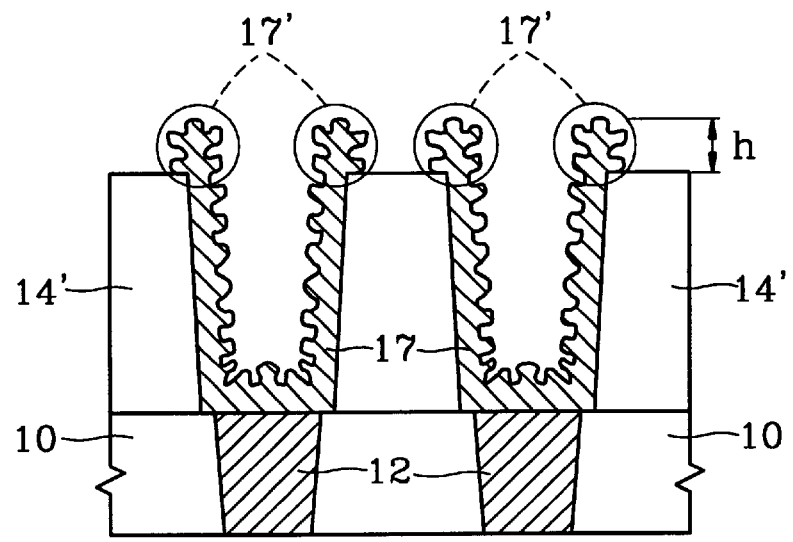
Figure 4:
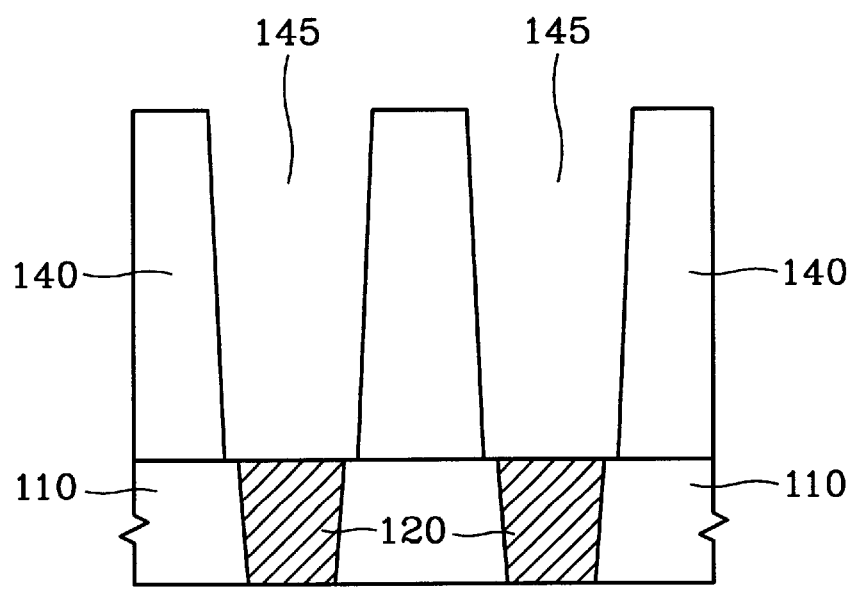
FIGS. 4 through 8 are cross-sectional views illustrating steps of manufacturing an integrated circuit capacitor according to a preferred embodiment of the present invention.

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. Like reference numerals refer to like elements throughout the drawings.

FIGS. 4 through 8 are sectional views illustrating steps of manufacturing a capacitor in which hemispherical grains (HSG) are formed on an inner surface of a cylindrical lower electrode, according to a preferred embodiment of the present invention. First, referring to FIG. 4, an interdielectric layer 110 in which devices such as a transistor (not shown) are formed, is selectively etched, and contact holes for exposing active regions of the substrate are formed on a lower substrate (not shown). Next, a conductive material, such as polycrystalline silicon in which impurities are doped, is deposited on the entire surface of the interdielectric layer 110 in which the contact holes are formed, and contact plugs 120 of lower electrodes are formed by removing and planarizing the resultant structure until the interdielectric layer 110 is exposed.

Next, a mold insulating layer 140, having openings 145 therein which expose the contact plugs 120, is formed on the planarized interdielectric layer 110. Specifically, the mold insulating layer 140 may comprise plasma enhanced tetraethylortho silicate (PE-TEOS) or phosphor silicate glass (PSG). Subsequently, a photoresist pattern (not shown) for exposing a region in which a lower capacitor electrode is to be formed, is formed on the PE-TEOS layer or the PSG layer. The PE-TEOS layer or the PSG layer is then selectively etched, using the photoresist pattern as an etching mask, to define openings 145 for exposing the contact plugs 120. Here, an etching stop layer (not shown) formed of, for example, a silicon nitride film, may be formed between the interdielectric layer 110 and the mold insulating layer 140. This etching stop layer can be used to facilitate proper termination of the etching step to define the openings 145.

Figure 5:
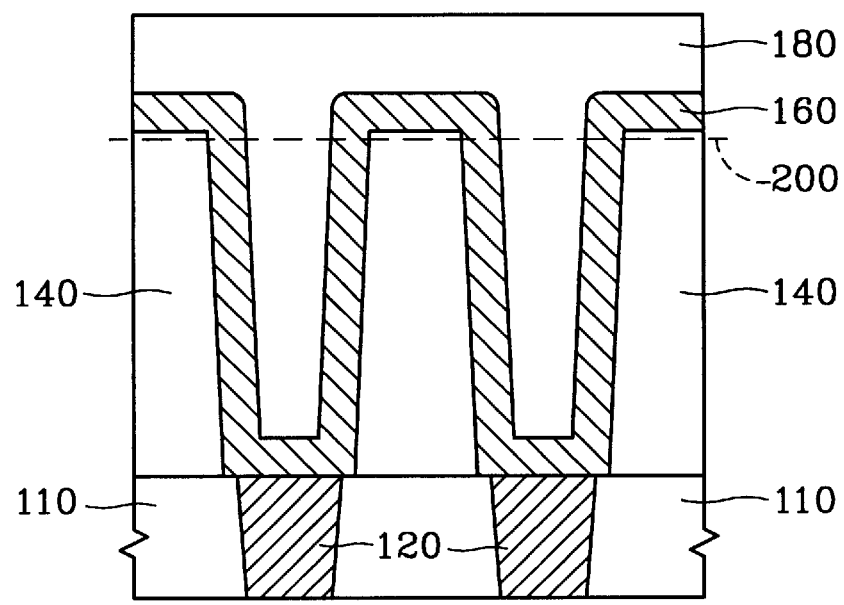

Referring to FIG. 5, an amorphous silicon layer is conformally deposited on the exposed contact plugs 120 and on the entire surface of the mold insulating layer 140 in which the openings (145 of FIG. 4) are formed, to form a lower electrode layer 160. Subsequently, a planarization insulating layer 180 for preventing a slurry or a polished residue from being attached to the concave portions of the lower electrode layer 160 during chemical mechanical polishing (CMP) is formed on the entire surface of the lower electrode layer 160. The planarization insulating layer 180 is preferably formed of a material having an etching selection ratio with respect to the mold insulating layer 140. The planarization insulating layer 180 may comprise undoped silicate glass (USG) or spin-on-glass (SOG).

Subsequently, the planarization insulating layer 180 and the lower electrode layer 160 are planarized (e.g., down to a polished line 200, marked as a dotted line in FIG. 5), until the mold insulating layer 140 is exposed. This planarization step may be performed by a CMP operation. Thus, the lower electrode layer 160 is removed on an upper surface of the mold insulating layer 140 and becomes separate cylindrical lower electrodes. The planarization insulating layer 180 remains in the concave portions of the lower electrodes as insulating regions 180'. A CMP process need not necessarily be used to separate the lower electrodes from each other. A blanket etch back process may be used instead of a CMP process, for example, in the embodiments of the present invention.

Figure 6:
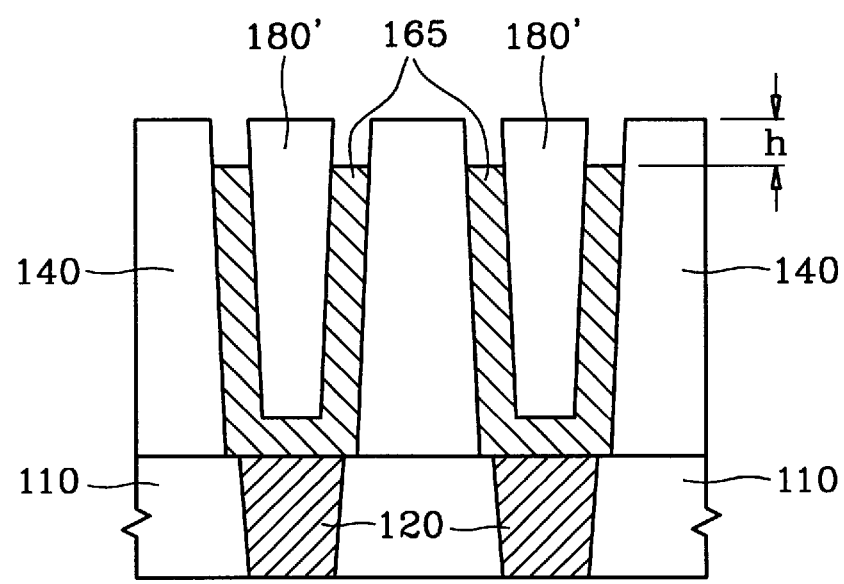

Referring to FIG. 6, parts of the upper surface of a cylindrical lower electrode are then etched back (i.e., recessed) to a predetermined depth h with respect to the mold insulating layer 140, to form a cylindrical lower electrode 165. The top extensions of the lower electrode 165 are recessed from the surfaces of the mold insulating layer 140 and the planarization insulating regions 180'. The etching time is preferably controlled to cause the etching depth h of the cylindrical lower electrode 165 to be about the same as or somewhat greater than the depth to which the mold insulating layer 140 is etched back and recessed during a subsequent wet-etching step for removing the planarization insulating regions 180'.

Figure 7:
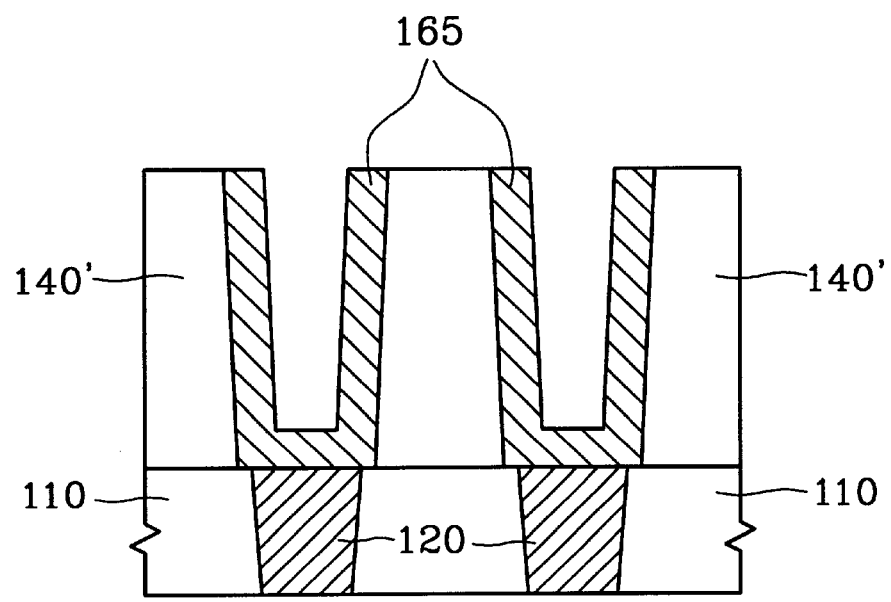

Referring to FIG. 7, the planarization insulating regions 180' remaining in the concave portions of the separated cylindrical lower electrodes 165 are then removed. Specifically, the planarization insulating regions 180', which may be formed of USG or SOG, may be removed by wet-etching using an etching solution having an etching selection ratio with respect to the mold insulating layer 140 (of FIG. 6), which may be formed of PE-TEOS or PSG such that the planarization insulating regions 180' are more readily etched than the mold insulating layer 140. For example, an etching solution, such as a hydrofluoric acid (HF) solution, may be used as a wet etchant for a predetermined time. Thus, as shown in FIG. 7, the planarization insulating regions 180' are removed and the mold insulating layer 140' is removed to a depth h in comparison with FIG. 6. As a result, the thickness of the mold insulating layer 140' and the height of the cylindrical lower electrode 165 may be about the same.

Figure 8:
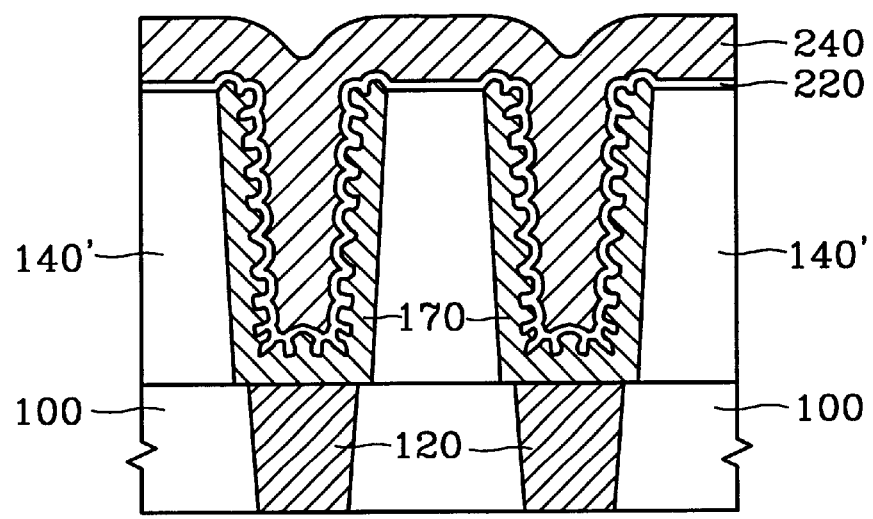

Subsequently, hemispherical silicon grains (HSG) are formed on the inner surfaces of the cylindrical lower electrodes 165 using conventional HSG formation techniques. Because external surfaces of the cylindrical lower electrodes 165 are surrounded by the mold insulating layer 140', the HSG is formed only on the internal surfaces of the cylindrical lower electrodes 170, as shown in FIG. 8. Next, a dielectric layer 220 and an upper electrode 240 are formed to complete the capacitor structure.

Alternatively, after the HSG is formed, the mold insulating layer 140' surrounding the cylindrical lower electrodes 170 may be removed. Then, the dielectric layer 220 and the upper electrode 240 may then be formed on the external surfaces of the cylindrical lower electrodes 170 in order to increase the active area of each capacitor.

As described above, the upper surface of the lower electrode layer may be removed to a depth in which the mold insulating layer is subsequently etched and removed, before the planarization insulating regions filling the insides of the lower electrodes are removed. Accordingly, even though parts of the mold insulating layer are typically removed when the planarization insulating layer is removed by etching, the lower electrode does not project above the mold insulating layer. Because the HSG is not formed on the external upper surfaces of the lower electrodes, short-circuiting between neighboring lower electrodes can be inhibited, and reliable capacitors can be manufactured.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit capacitor, comprising the steps of:
   forming a first electrically insulating layer having an opening therein, on a semiconductor substrate;
   forming an electrically conductive electrode layer on an upper surface of the first electrically insulating layer and on a sidewall of the opening within the first electrically insulating layer;
   covering the electrically conductive electrode layer with a second electrically insulating layer;
   planarizing the second electrically insulating layer and the electrically conductive electrode layer to expose the upper surface of the first electrically insulating layer and define a capacitor electrode layer on the sidewall of the opening;
   selectively etching back the capacitor electrode layer to expose the sidewall of the opening and define a lower capacitor electrode that is recessed relative to the upper surface of the first electrically insulating layer, using the planarized second electrically insulating layer and the first electrically insulating layer as an etching mask;
   removing the planarized second electrically insulating layer while simultaneously removing the upper surface of the first electrically insulating layer, to expose the lower capacitor electrode; and
   forming hemispherical silicon grains (HSGs) on an inner surface of the exposed lower capacitor electrode.

2. The method of claim 1, wherein said removing step comprises etching the planarized second electrically insulating layer at a first rate while simultaneously etching the upper surface of the first electrically insulating layer at a second rate slower than the first rate.

3. The method of claim 1, wherein the first electrically insulating layer comprises plasma-enhanced tetraethylorthosilicate (PETEOS) or phosphorus-doped silicate glass (PSG); and wherein the second electrically insulating layer comprises undoped silicate glass (USG) or spin-on-glass (SOG).

4. The method of claim 3, wherein said removing step comprises etching the planarized second electrically insulating layer using an etching solution comprising hydrochloric acid.

5. The method of claim 4, wherein said step of forming hemispherical silicon grains is followed by the step of etching back the first electrically insulating layer to expose an outer surface of the lower capacitor electrode.

6. The method of claim 1, wherein said step of forming hemispherical silicon grains is followed by the step of etching back the first electrically insulating layer to expose an outer surface of the lower capacitor electrode.

7. The method of claim 6, wherein said step of etching back the first electrically insulating layer is followed by the steps of:

forming a capacitor dielectric layer on the hemispherical silicon grains and on the outer surface of the lower capacitor electrode; and forming an upper capacitor electrode on the capacitor dielectric layer.

8. The method of claim 1, wherein said step of forming hemispherical silicon grains is followed by the steps of:

forming a capacitor dielectric layer on the lower capacitor electrode; and forming an upper capacitor electrode that extends on the capacitor dielectric layer and opposite the lower capacitor electrode.

9. A method of forming an integrated circuit capacitor, comprising the steps of:

forming an interdielectric layer having a conductive plug therein, on a surface of a semiconductor substrate;

forming a mold insulating layer on the interdielectric layer;

patterning the mold insulating layer to define an opening therein that exposes the conductive plug within the interdielectric layer;

forming an electrically conductive electrode layer on an upper surface of the mold insulating layer, on a sidewall of the opening within the mold insulating layer and on the conductive plug;

covering the electrically conductive electrode layer with a planarization insulating layer;

planarizing the planarization insulating layer and the electrically conductive electrode layer to expose the upper surface of the mold insulating layer and define a capacitor electrode layer that extends on the sidewall of the opening and on the conductive plug;

selectively etching back the capacitor electrode layer to expose the sidewall of the opening and define a lower capacitor electrode that is recessed relative to the upper surface of the mold insulating layer; then removing the planarization insulating layer while simultaneously removing a portion of the mold insulating layer, to expose an inner surface of the lower capacitor electrode; and forming hemispherical silicon grains (HSGs) on the inner surface of the lower capacitor electrode.

10. The method of claim 9, wherein said removing step comprises etching the planarized planarization insulating layer at a first rate while simultaneously etching the upper surface of the mold insulating layer at a second rate slower than the first rate.

11. The method of claim 9, wherein the mold insulating layer comprises plasma-enhanced tetraethylorthosilicate (PETEOS) or phosphorus-doped silicate glass (PSG); and wherein the planarization insulating layer comprises undoped silicate glass (USG) or spin-on-glass (SOG).

12. The method of claim 11, wherein said removing step comprises etching the planarization insulating layer using an etching solution comprising hydrochloric acid.

13. The method of claim 12, wherein said step of forming hemispherical silicon grains is followed by the step of etching back the mold insulating layer to expose an outer surface of the lower capacitor electrode.

14. The method of claim 9, wherein said step of forming hemispherical silicon grains is followed by the step of etching back the mold insulating layer to expose an outer surface of the lower capacitor electrode.

15. The method of claim 14, wherein said step of etching back the mold insulating layer is followed by the steps of:

forming a capacitor dielectric layer on the hemispherical silicon grains and on the outer surface of the lower capacitor electrode; and forming an upper capacitor electrode on the capacitor dielectric layer.

16. The method of claim 9, wherein said step of forming hemispherical silicon grains is followed by the steps of:

forming a capacitor dielectric layer on the lower capacitor electrode; and forming an upper capacitor electrode that extends on the capacitor dielectric layer and opposite the lower capacitor electrode.

* * * * *